United States Patent [19]
Petitbon et al.

[11] Patent Number: 6,006,979
[45] Date of Patent: Dec. 28, 1999

[54] METHOD OF BONDING A DIAMOND SUBSTRATE TO AT LEAST ONE METAL SUBSTRATE

[75] Inventors: Alain Petitbon, Saint-Arnoult; Eric Ranchy, Clamart, both of France

[73] Assignee: Alcatel, Paris, France

[21] Appl. No.: 08/961,236

[22] Filed: Oct. 30, 1997

[30] Foreign Application Priority Data

Oct. 31, 1996 [FR] France .................................. 96 13321

[51] Int. Cl.⁶ .................................................. C23C 12/00
[52] U.S. Cl. ..................... 228/122.1; 228/193; 228/44.7; 228/54
[58] Field of Search .................. 228/122.1, 193, 228/44.7, 54; 428/357

[56] References Cited

U.S. PATENT DOCUMENTS

| | | |
|---|---|---|
| 3,922,775 | 12/1975 | Potter . |
| 5,197,651 | 3/1993 | Nakamura et al. ..................... 228/44.7 |
| 5,423,475 | 6/1995 | Burke ....................... 228/193 |

FOREIGN PATENT DOCUMENTS

0717125A1  6/1996  European Pat. Off. .

OTHER PUBLICATIONS

B. Fiegl et al, "Diamond Films as Thermal Conductors and Electrical Insulators Applied to Semiconductor Power Modules", *Diamond and Related Materials,* vol. 3, No. 4/06, Apr. 1, 1994, pp. 658–662, XP000466679.

"Properties and Growth of Diamond 9EMIS Datareviews Series No. 9)", 1994, *Inspec Publication,* edited by Gordon Davies, London, GB XP002034103.

*Primary Examiner*—Patrick Ryan
*Assistant Examiner*—M. Alexandra Elve
*Attorney, Agent, or Firm*—Sughrue, Mion, Zinn, Macpeak & Seas, PLLC

[57] ABSTRACT

The invention concerns a method of bonding a diamond substrate to at least one metal substrate. According to the invention:

- at least one of the faces of the diamond substrate is covered with a piece of aluminum foil;
- said diamond substrate and said piece of aluminum foil are disposed in a chamber under a controlled atmosphere, and they are bonded together by a first thermocompression step under Argon or under a vacuum, thereby forming a composite multilayer substrate;
- said composite multilayer substrate is disposed on a metal substrate, the aluminum surface being in contact with the metal substrate; and
- said composite multilayer substrate and said metal substrate are bonded together by performing a second thermocompression step.

11 Claims, No Drawings

METHOD OF BONDING A DIAMOND SUBSTRATE TO AT LEAST ONE METAL SUBSTRATE

In electronic power modules, it is necessary to cool the high-potential electronic power components.

BACKGROUND OF THE INVENTION

Conventional cooling means involving soldering the component to a copper track, itself mounted on an electrically insulating ceramic of the AlN type or the like serving to insulate the high potential track and the component from the soleplate and grounded cooling device.

The copper-track-and-AlN multilayer structure is well suited to electrically insulating such a power component. However, the numerous interfaces, soldering, glues, and greases used to manufacture the multilayer structure constitute a considerable thermal resistance (about $15 \times 10^{-6}$ kelvins per watt (K/W) for 625 µm of AlN and 300 µm of Cu) affecting the capabilities of the structure to remove suitably the Joule heat losses from the power components, by itself or via a cooling device.

Furthermore, the more the potential is increased, the thicker the dielectric ceramic layer must be, whereas it is known that ceramic dielectrics are not good conductors of heat.

It is known that artificial diamond may be used, offering the advantage of being an excellent electrical insulator, and of having thermal conductivity approximately 10 times greater than AlN (diamond: 1,500 watts per meter kelvin (W/m.K); AlN: 180 W/m.K).

Bonding an artificial-diamond substrate to a copper or aluminum track generally involves:

a PVD metal-plating first step during which a fine layer of titanium, of platinum, and of gold is deposited on the artificial-diamond substrate; and a soldering second step in which conventional soldering methods are used to solder the diamond/Ti,Pl,Au composite substrate to the copper or aluminum track.

The heat dissipation gain is about 25% to 30% compared with the AlN multilayer structure.

That gain is small compared with what might be expected in view of the heat-conducting properties of artificial diamond.

This is due to the soldering which creates considerable thermal resistance (total thermal resistance of about $13 \times 10^{-6}$ K/W for 300 µm of diamond, 100 µm of solder, and 300 µm of Cu, including $12 \times 10^{-6}$ K/W induced by the solder and the interfaces).

Furthermore, the very high purchase price of artificial diamond makes the ratio between production cost and heat dissipation gain much higher than with the AlN technique and therefore prohibitive for mass production purposes.

OBJECTS AND SUMMARY OF THE INVENTION

An object of the present invention is to provide a method of bonding together a metal substrate and a diamond substrate with interfaces that have low thermal resistance.

To this end, the invention provides a method for bonding a diamond substrate to at least one metal substrate. In the steps of the method of the invention:

at least one of the faces of the diamond substrate is covered with a piece of aluminum foil;

said diamond substrate and said piece of aluminum foil are disposed in a chamber under a controlled atmosphere, and they are bonded together by a first thermocompression step under Argon or under a vacuum, thereby forming a composite multilayer substrate;

said composite multilayer substrate is disposed on a metal substrate, the aluminum surface being in contact with the metal substrate; and said composite multilayer substrate and said metal substrate are bonded together by performing a second thermocompression step.

In a variant implementation, said composite multilayer substrate comprises said diamond substrate sandwiched between two pieces of aluminum foil, and metal substrates are coupled to respective ones of the pieces of aluminum foil.

In an implementation of the first thermocompression step of the method of the invention, the thermo-compression temperature lies in the range 550° C. to 650° C., and the pressure applied for performing the thermocompression lies in the range 100 kilograms per square centimeter (kg/cm$^2$) to 150 kg/cm$^2$.

When the metal substrate is a copper substrate, in the second thermocompression step, the thermocompression temperature lies in the range 500° C. to 550° C., and the pressure applied for performing the thermocompression lies in the range 100 kg/cm$^2$ to 150 kg/cm$^2$.

MORE DETAILED DESCRIPTION

Other advantages and characteristics of the present invention appear from the following description.

Thermocompression significantly reduces the thermal resistance of the interfaces between the various materials.

However, to thermocompress copper directly on a diamond-type substrate, the temperatures involved are about 1,000° C., whereas it is known that CVD diamond is not stable beyond 800° C. to 900° C., and is transformed into graphite.

To mitigate this prohibitive drawback, the method of the invention for bonding a diamond substrate to at least one metal substrate is based on two thermocompression steps.

The first thermocompression step involves the diamond substrate and at least one piece of aluminum foil.

One of the faces of the diamond substrate is covered with a piece of aluminum foil.

The aluminum foil-and-diamond assembly is disposed in a thermocompressor chamber under a controlled atmosphere.

The first thermocompression step takes place under Argon or under a vacuum, and it enables the aluminum foil and the diamond substrate to be bonded together, thereby forming a composite multilayer substrate. In a variant implementation, the diamond substrate is sandwiched between two pieces of aluminum foil. The temperatures involved for performing the thermocompression are about 600° C., at which CVD diamond is stable.

The composite multilayer substrate formed in the first thermocompression step is disposed on one or more metal substrates, the aluminum surface(s) being in contact with the metal substrate(s).

A second thermocompression step then enables the aluminum face(s) and the metal substrate(s) to be bonded together. Once again, the thermocompression temperatures involved are about 600° C.

In an implementation of the first thermocompression step of the method of the invention, the thermocompression temperature lies in the range 550° C. to 650° C., and the pressure applied for performing the thermocompression lies in the range 100 kilograms per square centimeter (kg/cm$^2$) to 150 kg/cm$^2$.

When the metal substrate is a copper substrate, the temperature of the second thermocompression lies in the range 500° C. to 550° C., and the pressure applied for the second thermocompression lies in the range 100 kg/cm$^2$ to 150 kg/cm$^2$.

In a non-limiting illustrative implementation of the invention, a 300-µm diamond substrate, a 100-µ piece of aluminium foil, and a 300-µm copper substrate were bonded together. The total thermal resistance was 2.9×10$^{-6}$ K/W, i.e. five times less than in the prior art.

Numerous advantages result directly from this reduction in thermal resistance:

firstly, it makes the use of diamond competitive even if it costs about ten times more to buy than AlN;

secondly, it enables electronic power modules to be made more compact by reducing the thicknesses of insulation, and by reducing the sizes of the heat-removal means; and finally, for equivalent dimensions, it enables much higher power to be passed through the electronic modules.

Naturally, the invention is not limited to the above-described implementation, but rather numerous variants of it are accessible to a person skilled in the art without going beyond the invention. In particular, the material of the metal substrate may be other than copper, and similarly the aluminum foil may be replaced with any material that enables diamond substrates to bonded to metal substrates by thermocompression at temperatures lower than the transformation temperatures of diamond.

We claim:

1. A method of bonding a diamond substrate to at least one metal substrate, comprising the steps of:
   (A) providing a diamond substrate and covering at least one of the faces of the diamond substrate with a piece of aluminum foil;
   (B) disposing the foil-covered diamond substrate in a chamber under a controlled atmosphere, and conducting a first thermocompression step under Argon to form a composite multilayer substrate;
   (C) disposing said composite multilayer substrate on a metal substrate, wherein the aluminum surface is in contact with the metal substrate; and
   (D) performing a second thermocompression step wherein said composite multilayer substrate and said metal substrate are bonded together.

2. A method according to claim 1, wherein said diamond substrate is sandwiched between two pieces of aluminum foil.

3. A method according to claim 1, wherein, in the first thermocompression step, the thermocompression temperature lies in the range 550° C. to 650° C., and the pressure applied for performing the thermocompression lies in the range 100 kilograms per square centimeter (kg/cm$^2$) to 150 kg/cm$^2$.

4. A method according to claim 1, wherein the metal substrate is a copper substrate.

5. A method according to claim 4, wherein, in the second thermocompression step, the thermocompression temperature lies in the range 500° C. to 550° C., and the pressure applied for performing the thermocompression lies in the range 100 kg/cm$^2$ to 150 kg/cm$^2$.

6. A method of bonding a diamond substrate to at least one metal substrate, comprising the steps of:
   (A) providing a diamond substrate and covering at least one of the faces of the diamond substrate with a piece of aluminum foil;
   (B) disposing the foil-covered diamond substrate in a chamber under a controlled atmosphere, and conducting a first thermocompression step under a vacuum, to form a composite multilayer substrate;
   (C) disposing said composite multilayer substrate on a metal substrate, wherein the aluminum surface is in contact with the metal substrate; and
   (D) performing a second thermocompression step wherein said composite multilayer substrate and said metal substrate are bonded together.

7. A method according to claim 6, wherein said diamond substrate is sandwiched between two pieces of aluminum foil.

8. A method according to claim 6, wherein, in the first thermocompression step, the thermocompression temperature lies in the range 550° C. to 650° C., and the pressure applied for performing the thermocompression lies in the range 100 kilograms per square centimeter (kg/cm$^2$) to 150 kg/cm$^2$.

9. A method according to claim 6, wherein the metal substrate is a copper substrate.

10. A method according to claim 9, wherein, in the second thermocompression step, the thermocompression temperature lies in the range 500° C. to 550° C., and the pressure applied for performing the thermocompression lies in the range 100 kg/cm$^2$ to 150 kg/cm$^2$.

11. A solder-free method of bonding an artificial-diamond substrate to a copper or aluminum track, comprising the steps of:
   (A) providing a diamond substrate and covering at least one of the faces of the diamond substrate with a piece of aluminum foil;
   (B) disposing the foil-covered diamond substrate in a chamber under a controlled atmosphere, and conducting a first thermocompression step under Argon or under a vacuum, to form a composite multilayer substrate;
   (C) disposing said composite multilayer substrate on a metal substrate, wherein the aluminum surface is in contact with the metal substrate; and
   (D) performing a second thermocompression step wherein said composite multilayer substrate and said metal substrate are bonded together.

* * * * *